US008951601B2

(12) United States Patent
Li et al.

(10) Patent No.: US 8,951,601 B2
(45) Date of Patent: Feb. 10, 2015

(54) ELECTROCHEMICAL CELL STRUCTURE AND METHOD OF FABRICATION

(75) Inventors: Shunpu Li, Cambridgeshire (GB); Masaya Ishida, Cambridgeshire (GB)

(73) Assignee: Seiko Epson Corporation, Tokyo (JP)

( * ) Notice: Subject to any disclaimer, the term of this patent is extended or adjusted under 35 U.S.C. 154(b) by 2080 days.

(21) Appl. No.: 11/598,738

(22) Filed: Nov. 14, 2006

(65) Prior Publication Data
US 2007/0119048 A1 May 31, 2007

(30) Foreign Application Priority Data
Nov. 25, 2005 (GB) .................................. 0524075.9

(51) Int. Cl.
B05D 5/12 (2006.01)

(52) U.S. Cl.
USPC .............................................. 427/75; 427/74

(58) Field of Classification Search
USPC ........................................................ 427/74
See application file for complete search history.

(56) References Cited

U.S. PATENT DOCUMENTS

| | | | |
|---|---|---|---|
| 4,927,721 A | 5/1990 | Gratzel et al. | |
| 5,830,597 A | 11/1998 | Hoffmann et al. | |
| 6,069,313 A | 5/2000 | Kay | |
| 6,096,313 A | 8/2000 | Jäger et al. | |
| 6,310,282 B1 | 10/2001 | Sakurai et al. | |
| 6,468,819 B1 | 10/2002 | Kim et al. | |
| 6,660,556 B2 | 12/2003 | Hashimoto et al. | |
| 6,699,456 B1 | 3/2004 | Krampitz et al. | |
| 6,797,211 B1 | 9/2004 | Guenther et al. | |
| 2001/0023110 A1* | 9/2001 | Fukuzumi et al. | 438/396 |
| 2002/0001776 A1* | 1/2002 | Mori et al. | 430/302 |
| 2002/0040728 A1* | 4/2002 | Yoshikawa | 136/263 |
| 2002/0187895 A1* | 12/2002 | Izaki et al. | 502/330 |
| 2003/0121545 A1 | 7/2003 | Schwirtlich et al. | |
| 2003/0137557 A1 | 7/2003 | Nakamura | |
| 2003/0140959 A1 | 7/2003 | Gaudiana et al. | |
| 2003/0148024 A1 | 8/2003 | Kodas et al. | |
| 2003/0170437 A1 | 9/2003 | Kawashima et al. | |

(Continued)

FOREIGN PATENT DOCUMENTS

| | | |
|---|---|---|
| EP | 0 855 726 A1 | 7/1998 |
| JP | 56-054581 | 5/1981 |

(Continued)

OTHER PUBLICATIONS

Chou "Imprint Lithography with 25-Nanometer Resolution" Science, Apr. 1996. vol. 272. pp. 85-87.*

(Continued)

*Primary Examiner* — Michael Cleveland
*Assistant Examiner* — Austin Murata
(74) *Attorney, Agent, or Firm* — Oliff PLC

(57) ABSTRACT

One limitation to the realisation of mass produced electrochemical cells is a lack of high resolution patterning techniques providing accurate alignment. A method of fabricating a patterned structure on a polymer layer for the manufacture of an electrochemical cell is provided. The method comprises: depositing a polymer layer upon a substrate; and stamping the polymer layer to form an embossed polymer layer using an embossing tool, the embossing tool having a first array of adjacent cells, spaced from one another and extending from the stamping face of the embossing tool and thereby forming a second array of adjacent cells, spaced from one another and extending as cavities within the embossed polymer layer.

3 Claims, 5 Drawing Sheets

(56) References Cited

U.S. PATENT DOCUMENTS

| | | | |
|---|---|---|---|
| 2003/0230768 A1* | 12/2003 | Seitz | 257/200 |
| 2004/0016886 A1 | 1/2004 | Ringermacher et al. | |
| 2004/0025934 A1 | 2/2004 | Chittibabu et al. | |
| 2004/0028875 A1 | 2/2004 | Van Rijn et al. | |
| 2004/0112420 A1 | 6/2004 | Spivack et al. | |
| 2004/0112421 A1* | 6/2004 | Spivack et al. | 136/256 |
| 2004/0115858 A1* | 6/2004 | Spivack et al. | 438/82 |
| 2004/0135497 A1 | 7/2004 | Kim et al. | |
| 2004/0211461 A1 | 10/2004 | Murai et al. | |
| 2005/0009224 A1* | 1/2005 | Yang et al. | 438/57 |
| 2005/0062033 A1* | 3/2005 | Ichihara et al. | 257/17 |
| 2005/0071969 A1 | 4/2005 | Sirringhaus et al. | |
| 2005/0071989 A1 | 4/2005 | Nishiyama | 29/739 |
| 2005/0153114 A1 | 7/2005 | Gupta et al. | |
| 2005/0191783 A1* | 9/2005 | Toyoda et al. | 438/34 |
| 2005/0260786 A1 | 11/2005 | Yoshikawa et al. | |
| 2006/0021647 A1 | 2/2006 | Gui et al. | |
| 2006/0046512 A1 | 3/2006 | Nakamura et al. | |
| 2006/0086528 A1 | 4/2006 | Clare et al. | |
| 2006/0148167 A1* | 7/2006 | Brown et al. | 438/232 |
| 2007/0096080 A1 | 5/2007 | Cain et al. | |
| 2007/0209696 A1 | 9/2007 | Duerr et al. | |
| 2009/0038683 A1 | 2/2009 | Walter et al. | |
| 2011/0027986 A1* | 2/2011 | Vecchione et al. | 438/637 |
| 2011/0049556 A1* | 3/2011 | Fujimoto et al. | 257/99 |

FOREIGN PATENT DOCUMENTS

| | | |
|---|---|---|
| JP | 2002-075472 | 3/2002 |
| JP | 2003-142171 | 5/2003 |
| JP | 2004-074609 | 3/2004 |
| JP | 2004-228449 | 8/2004 |
| JP | 2005-010804 | 1/2005 |
| JP | 2005-222838 | 8/2005 |
| JP | 2005-251605 | 9/2005 |
| JP | 2005-259478 | 9/2005 |
| JP | 2005-302509 | 10/2005 |
| JP | A-2009-516382 | 4/2009 |
| WO | WO 01/61763 | 8/2001 |
| WO | WO 02/29912 A1 | 4/2002 |
| WO | WO 2004/031444 * | 4/2004 |
| WO | WO 2004/055919 A3 | 7/2004 |
| WO | WO 2005/004194 A2 | 1/2005 |
| WO | WO 2005/104152 A1 | 11/2005 |

OTHER PUBLICATIONS

Henrik Lindstrom et al., "A New Method for Manufacturing Nanostructured Electrodes on Plastic Substrates," American Chemical Society, Nano Letters, vol. 1, No. 2, pp. 97-100, 2001.

Satoshi Uchida et al. "Preparation of $TiO_2$ nanocrystalline electrode for dye-sensitized solar cells by 28 GHz microwave.Irradiation," Solar Energy Materials & Solar Cells 81, pp. 135-139, 2004.

Superlattice nanomaterials Lab, "Self-organized Nanopatterned Devices", http://web.archive.org/web/20041231051140/http://msfl.kaist.ac.kr/research/04_self.html published Dec. 31, 2004.

http://hyperphysics.phy-astr.gsu.edu/hbase/ems3.html.

M. Tomiha et al., "Sintering of Titanium Oxide Films by 28 GHZ Microwave Irradiation and the Application to Dye-Sensitized solar cells", Mar. 25, 2003.

Uchida et al. "Preparation of TiO2 nanocrystalline electrode for dye sensitized solar cells by 28 GHz microwave irradiation" 2004.

U.S. Office Action issued in U.S Appl. No. 11/598,799 mailed Nov. 17, 2009.

U.S. Office Action issued in U.S Appl. No. 11/598,799 mailed Jun. 17, 2010.

U.S. Office Action issued in U.S Appl. No. 11/598,799 mailed Jan. 6, 2011.

U.S. Office Action issued in U.S Appl. No. 11/598,799 mailed Jun. 8, 2011.

* cited by examiner

1. Embossing
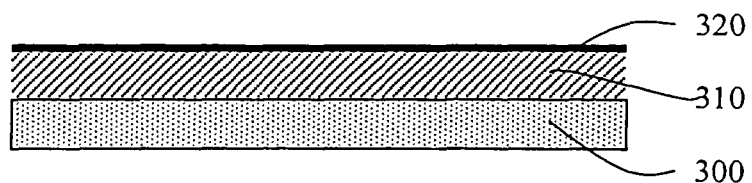
2. Electrode deposition
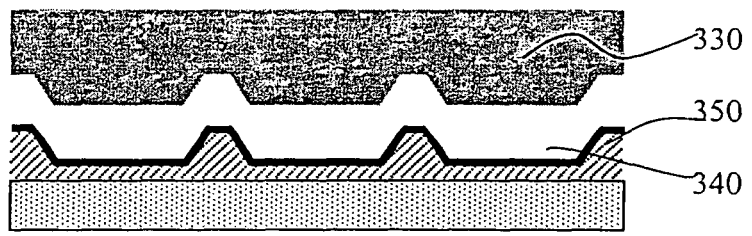
3. SAM application
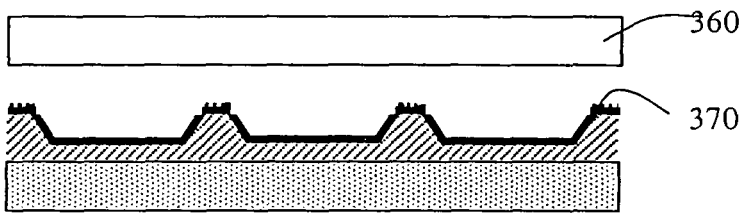
4. Ink-jet printing semiconductor and dye
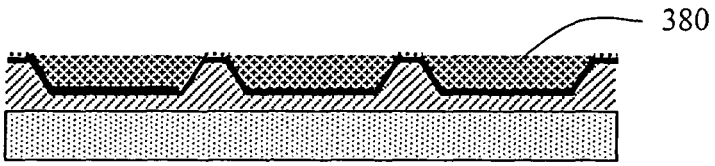
Figure 6. Illustration of fabrication of tapered bank structure and electrodes.

ELECTROCHEMICAL CELL STRUCTURE AND METHOD OF FABRICATION

FIELD OF THE INVENTION

The present invention relates, in general, to an electrochemical cell and its method of manufacture including micro-embossing and ink-jet printing steps. In particular, the present invention relates to the fabrication of a bank structure during manufacture of the electrochemical cell.

BACKGROUND OF THE INVENTION

A Dye-Sensitized Solar Cell (DSSC) functions as an electrochemical cell. U.S. Pat. No. 4,927,721 entitled "Photo-Electrochemical Cell", by M Gratzel et al discloses a typical DSSC. As illustrated in FIG. 1: a typical DSSC 10 comprises a substrate 1; a first electrode 2; a metal oxide layer 3; a functional dye layer 4; an electrolyte layer 5; a second electrode 6; and a second insulating layer 7.

The DSSC 10 generates charge by the direct absorption of visible light. Since most metal oxides absorb light predominantly in the ultra-violet region of the electromagnetic spectrum, the sensitiser (dye) 4 is absorbed onto the surface of the metal oxide layer 3 to extend the light absorption range of the metal oxide layer 3 into the visible light region.

In order to increase the amount of light that the metal oxide layer 3 can absorb, at least some portion of the metal oxide layer 3 is made porous, increasing the surface area of the metal oxide layer 3. This increased surface area can support an increased quantity of functional dye 4 resulting in increased light absorption and improving the energy conversion efficiency of the DSSC by more than 10%.

DSSC devices known in the art can be improved by fabricating the metal oxide layer as an array of micro-scale, high-density cells surrounded by barriers such as banks. In order to fabricate the banks, device fabrication techniques such as optical lithography, micro-embossing, optical interference lithography etc. can be employed because these techniques have become a key technology for mass production patterning techniques. Whilst these techniques allow for high-resolution patterning upon a substrate, tool alignment with previously defined structures upon the substrate is difficult. Accurate alignment is especially difficult in the case of large area, flexible substrates, due to the occurrence of warping, thermal expansion or shrinking of the substrate. Furthermore, in the case of roll-to-roll fabrication techniques, non-uniform distortions due to the necessary tensions applied to the substrate during transfer can cause further alignment difficulties.

One limitation to the realisation of mass produced DSSCs is therefore a lack of high resolution patterning techniques providing good alignment.

SUMMARY OF THE INVENTION

According to a first aspect of the present invention, there is provided a method of fabricating a patterned structure on a polymer layer for the manufacture of an electrochemical cell, the method comprising: depositing a polymer layer upon a substrate; stamping the polymer layer to form an embossed polymer layer using an embossing tool, the embossing tool having a first array of adjacent cells, spaced from one and another and extending from the stamping face of the embossing tool and thereby forming a second array of adjacent cells, spaced from one and another and extending as cavities within the embossed polymer layer.

According to a second aspect of the present invention, there is provided a method of fabricating a patterned structure on a polymer layer for the manufacture of an electrochemical cell, the method comprising: depositing a conductive layer as a first electrode layer upon a substrate; depositing a polymer layer upon the first electrode layer; stamping the polymer layer to form an embossed polymer layer using an embossing tool, the embossing tool having a first array of adjacent cells, spaced from one and another and extending from the stamping face of the embossing tool, thereby forming a second array of adjacent cells, spaced from one and another and extending as cavities within the embossed polymer layer; and removing the remaining portions of the embossed polymer layer to reveal the first electrode layer within a plurality of cavities.

According to a third aspect of the present invention, there is provided method of fabricating a patterned structure on a polymer layer for the manufacture of an electrochemical cell, the method comprising: depositing a polymer layer and a conductive layer as first electrode upon a substrate; and stamping the polymer and conductive layers to form an embossed structure using an embossing tool, the embossing tool having a first array of adjacent cells, spaced from one another and extending from the stamping face of the embossing tool and thereby forming a second array of adjacent cells, spaced from one another and extending as cavities within the embossed polymer layer.

The present invention therefore provides new approaches of micro-embossing obviating or at least mitigating the problems associated with the prior art. The pre-patterned substrate effectively defines a necessary resolution, while the device components are built up by subsequent inkjet printing.

Preferred embodiments of the present invention are included in the dependent claims.

BRIEF DESCRIPTION OF THE DRAWINGS

Embodiments of the present invention will now be described by way of further example only and with reference to the accompanying drawings, in which:

FIG. 6 is a schematic diagram of the fabrication of a bank structure according to a fifth embodiment of the present invention.

DETAILED DESCRIPTION

Figure 1:
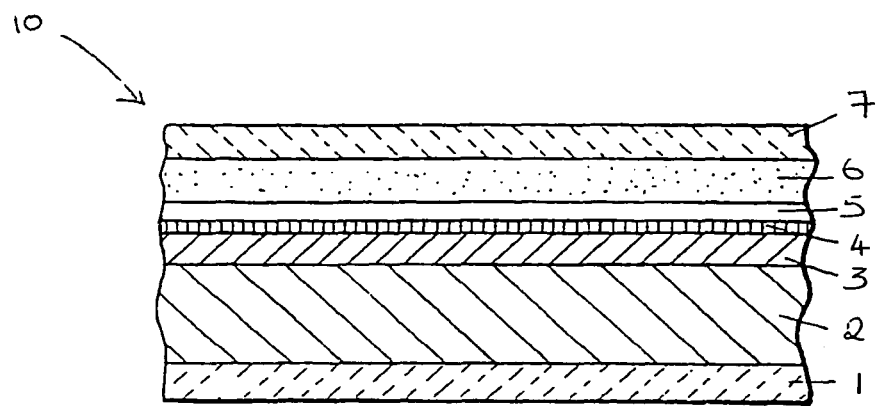
FIG. 1 is a schematic diagram of a Dye-Sensitized Solar Cell (DSSC) as is known in the art.

Throughout the following description, like reference numerals identify like parts.

Figure 2:
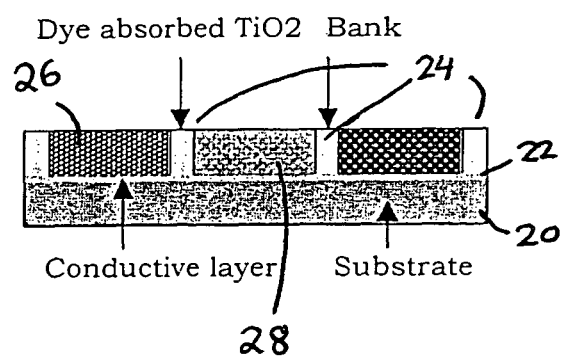
FIG. 2 is a schematic diagram of a portion of an electrochemical cell according to a first embodiment of the present invention.

Referring to FIG. 2, a portion of an electrochemical cell according to a first embodiment of the present invention comprises a substrate wafer 20 having a conductive layer 22 as first electrode deposited thereon. A bank structure 24 is formed on the electrode layer 22 prior to the application of a metal oxide layer 26. A discontinuous metal oxide layer is subsequently formed by inkjet printing the metal oxide into cells 28 to form an array of micro-scale, high density cells 28 surrounded by the banks 24 such that no metal oxide bridges the bank structure 24 to cause image deterioration by colour dye contamination.

Preferred embodiments of the present invention for the formation of bank structures or the like will now be described.

Figure 3:
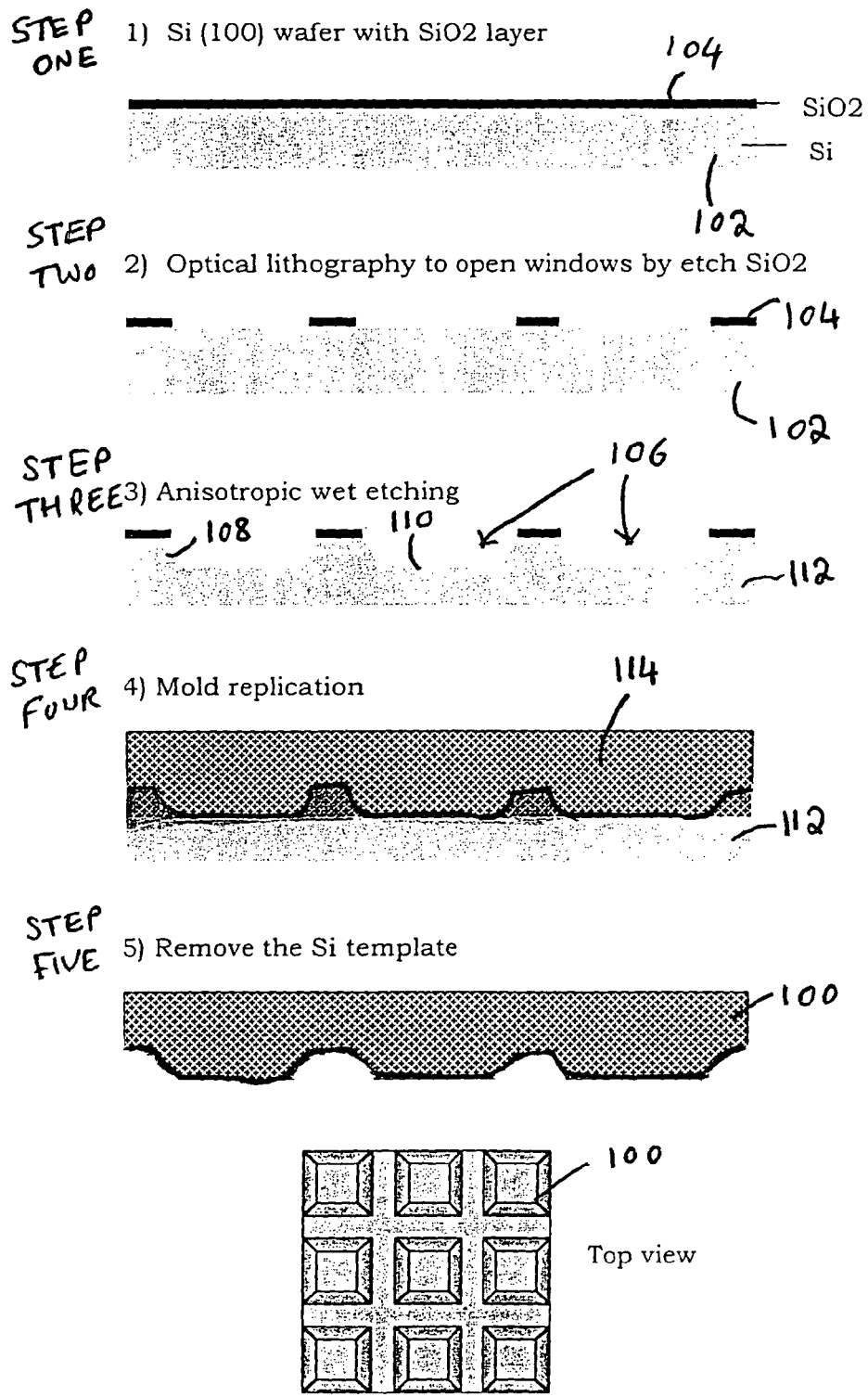
FIG. 3 is a schematic diagram of the fabrication of a tapered mold for forming an embossing stamp according to a second embodiment of the present invention.

Referring to FIG. 3, the fabrication of a tapered mold for forming an embossing stamp 100 according to a second embodiment of the present invention comprises the following steps. In Step One, a silicon (Si) wafer 102 is coated with a silicon dioxide ($SiO_2$) layer 104 of around 200 nm to 300 nm thickness. In Step Two, optical lithography and plasma etching are applied to remove portions of the $SiO_2$ layer 104 and generate an array of windows across the $SiO_2$ layer 104. A $SF_6$ or $CF_4+O_2$ plasma is used to etch through the $SiO_2$ layer 104 and the wet etching is carried with potassium hydroxide aqueous solution (250 g/L) under 80° C. In Step Three, anisotropic wet etching is applied to obtain an array of tapered cavities 106 within the silicon wafer 102 at the locations of the $SiO_2$ windows. The sidewalls 108 of each cavity 106 are inwardly tapering and extend within the silicon wafer 102 to a flat cavity base 110. On removal of the remaining $SiO_2$ layer 104 using a HF water solution, a silicon wafer template is obtained, which becomes a tapered mold 112. In other words, the silicon wafer template has a plurality of recesses each of which has a tapered shape.

Stamp replication is illustrated in Step Four. A material, such as a metal, ceramic or polymer with high stiffness 114 is deposited by electroplating, casting, thermal evaporation or sputtering etc. onto the tapered mold 112. In Step Five, the tapered mold 112 is removed, leaving the embossing stamp 100. Step Five illustrates a side view and top view of the embossing stamp.

Figure 4:
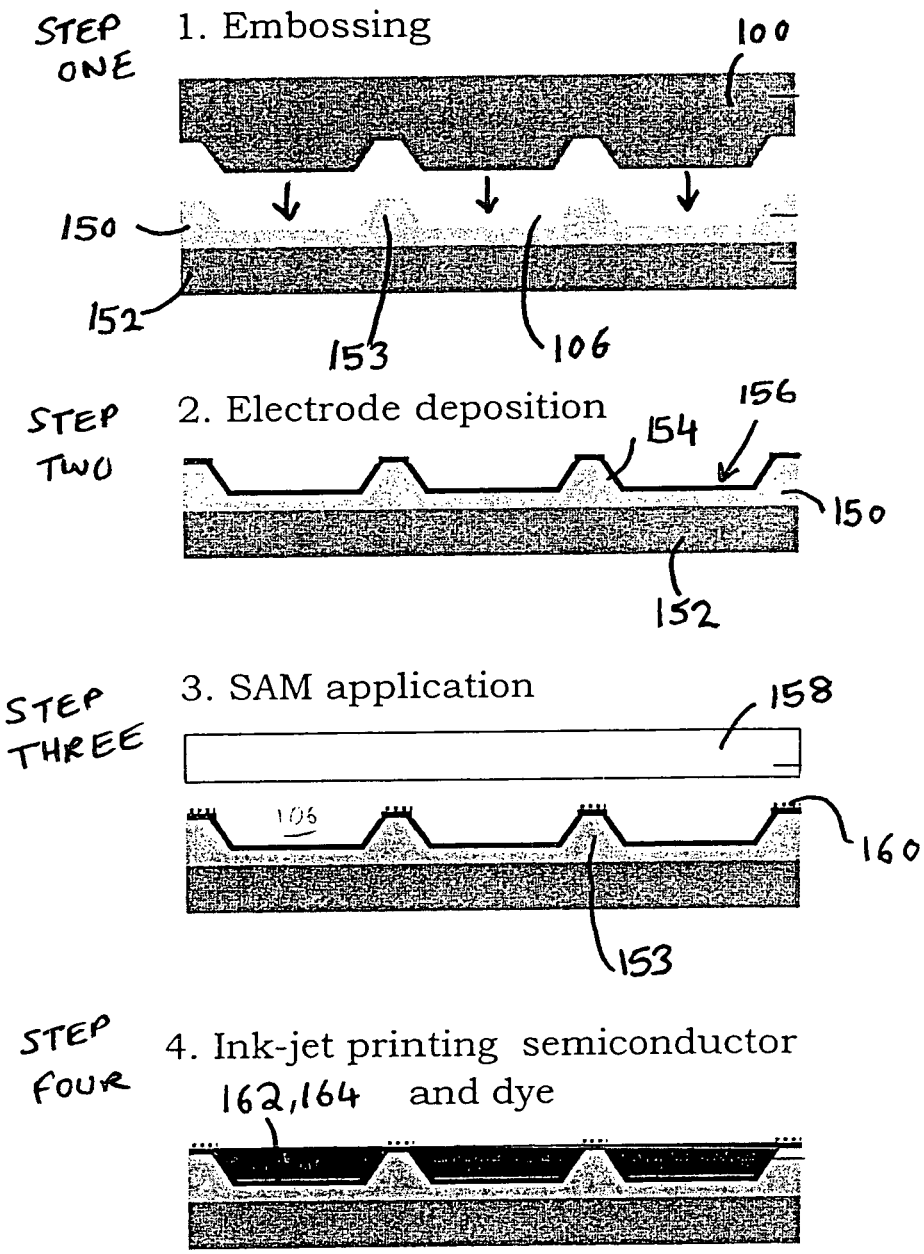
FIG. 4 is a schematic diagram of the fabrication of a tapered bank structure using the embossing tool of FIG. 3 according to a third embodiment of present invention.

Referring to FIG. 4 a schematic diagram of the fabrication of a tapered bank structure using the embossing stamp 100 of FIG. 3 comprises the following steps. In Step One, a polymer layer 150, around 2 μm thick and formed of a polymethyl methacrylate (PMMA) is spin-coated and baked at 120° C. and thereby deposited upon a substrate 152 such as a glass or polyethylene naphthalate (PEN). The embossing stamp 100 is subsequently brought against the polymer layer 150 at 160° C. under 20 bar pressure. The arrangement is subsequently cooled to room temperature and the embossing stamp 100 removed to provide an array of tapered cavities 106 within the polymer layer 150 separated by an array of banks 153.

In Step Two, an electrode 154 is formed by depositing conductive material upon the surface of the polymer layer 150. Also in Step Two, an $O_2$ plasma treatment is applied to provide a hydrophilic/lyophilic surface 156 upon the conductive layer 154.

Subsequently, in Step Three, a Self-Assembled Monolayer molecule (SAM) 158, such as 1H, 1H, 2H, 2H-perfluorodecyl-trichlorosilane solution (approximately 0.01 mol in hexane) for conductive oxide, is applied by soft contact printing. The SAM provides a hydrophobic surface 160 upon the uppermost portion of the banks 153 forming the array of tapered cavities 106, while the flat cavity base 110 remains hydrophilic. In Step Four, a metal oxide semiconductor colloidal suspension 162 and functional dye solution 164 (such as ruthenium dye complex) is deposited into the cavities 106 using ink-jet printing techniques.

After drying, the device is completed by arranging a counter electrode (not shown) such as a Pt/ITO (indium tin oxide) coated glass or PEN at a 20 μm distance having an electrolyte inserted into the device. As an example, the electrolyte is a redox electrolyte such as an iodine and potassium iodine mixture in acetonitrile.

Figure 5:
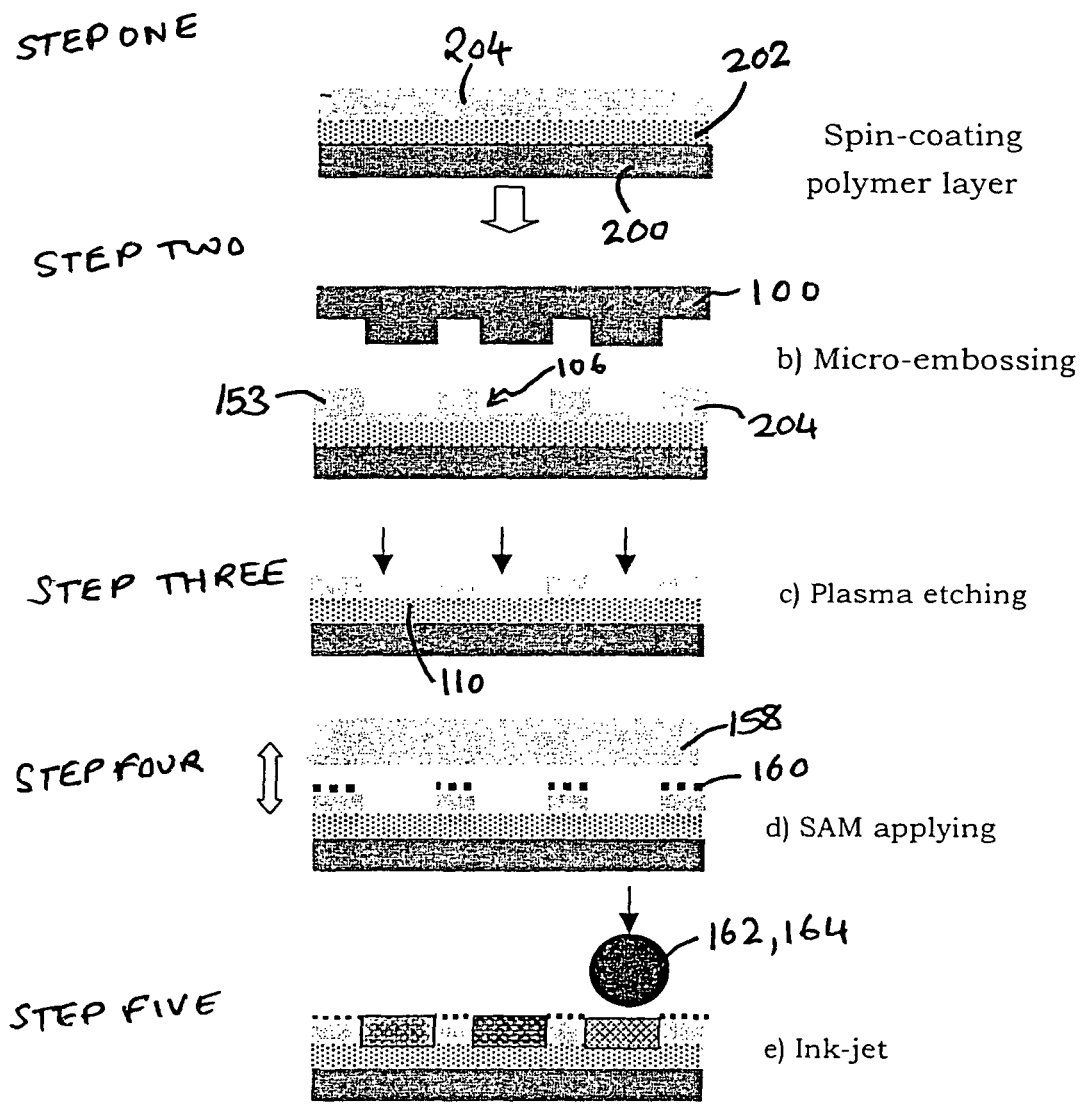
FIG. 5 is a schematic diagram of the fabrication of a bank structure according to a fourth embodiment of the present invention.

Referring to FIG. 5, a schematic diagram of the fabrication of a bank structure according to a fourth embodiment of the present invention comprises the following steps. In Step One, a glass or polyethylene naphthalate (PEN) is provided as a substrate 200 upon which is spin-coated a conductive layer 202. A polymer layer 204, around 2 μm thick and formed of polymethyl methacrylate (PMMA), is spin-coated and baked at 120° C. In Step Two, an embossing stamp 100 is subsequently brought against the polymer layer 204 at 160° C. under 20 bar pressure. The arrangement is subsequently cooled to room temperature and the embossing stamp 100 removed to provide an array of cavities 106 within the polymer layer 150 separated by an array of banks 153.

For spin-coating deposition of conductive layer 202, the prefabricated bank structure is not necessarily a tapered shape. In this case, the embossed structure can be fabricated by using an embossing stamp 100 with vertical sidewall although an embossing stamp having a tapered profile could equally be used. After embossing the polymer layer 204, the remaining polymer layer 204 covering a base 110 of each cavity 106 is removed by plasma etching (Step Three). Steps Four and Five are the same as carried out and described above in Steps Three and Four in accordance with FIG. 4.

Referring to FIG. 6, a schematic diagram of the fabrication of another type of bank structure using micro-embossing in accordance with the present invention comprises the following steps. In Step One, a polymer layer (such as photoresist AZ 5214E) 310, around 2 μm thick is spin-coated on the substrate 300 and baked at 120° C. Afterwards an approximately 100 nm thick Au layer 320 is thermally evaporated onto the resist surface. In Step Two, an embossing tool 330 is brought against the sample surface at 140° C. under 20 bar pressure. The arrangement is subsequently cooled to room temperature and the embossing stamp 330 is removed to provide an array of tapered cavities 340 within the polymer layer 310 separated by an array of banks 350. In Step Three, a SAM such as 1H, 1H, 2H, 2H-perfluorodecanethiol (0.005 mol in ethanol) is applied to the gold surface. After inking a polydimethylsiloxane (PDMS) block 360 using the solution for about one minute, the PDMS stamp 360 is dried using nitrogen flow. Then, the stamp is brought into close contact with the structured sample surface for 30 seconds, and a hydrophobic SAM layer 370 is formed. To create better contact printing quality and improve the wetting contrast, the sample can be treated by oxygen plasma before the contact printing. Then $TiO_2$ colloid and dye 380 are printed by ink-jet printing into the cavities.

After drying, the device is completed by arranging a counter electrode (not shown) such as a Pt/ITO coated glass or PEN at a 20 μm distance having an electrolyte inserted into the device. As an example, the electrolyte is a redox electrolyte such as an iodine and potassium iodine mixture in acetonitrile.

In this embodiment a tapered embossing tool was used to improve the structured Au film quality. A standard embossing tool with vertical walls can be used as well. Because the cavities are filled by semiconductor, any small cracks or punch-through of the Au layer will not cause obvious damage of the device quality.

In another embodiment, a conductive polymer layer (such as polyaniline) can be introduced in between the metal layer 320 and the embossed polymer layer 310 to ensure conductivity. The conductive polymer layer can follow the cavity shape and can be difficult to be punch through. As the Au layer is 100 nm thick, the image can only be viewed through the second electrode, which is made transparent. This limitation can be overcome by selecting a transparent first electrode, or depositing a very thin metal (which is used only for touching SAM layer) on a transparent conductive polymer layer.

The foregoing description has been given by way of example only and a person skilled in the art will appreciate that modifications can be made without departing from the scope of the present invention. Other embodiments considered to be within the scope of the present invention include:

(1) Alternative deposition techniques include doctor blading, printing (e.g. screen printing, offset printing, flexo printing, pad printing, and inkjet printing), evaporation, sputtering, chemical vapour deposition, spin-coating, dip and spray coating and electroplating.

(2) Alternative ways of surface treatment of a conducting layer include corona discharge treatments, UV-ozone treatments, chemical reaction, coating and vacuum deposition.

(3) Alternative materials for the SAM include polymer or small molecules with head group, such as silane, thiol etc. and tail groups, such as —$NH_2$ —COOH, —OH, —F, —CH3 etc.

(4) The conductive materials can be metals, organic or inorganic colloidal suspension, conductive polymer, such as a poly(3,4-ethylenedioxythiophene)-polystyrenesulphonic acid (PEDOT-PSS) water suspension and polyaniline.

(5) The fabrication process can be used for both "sheet-to-sheet" and "roll-to-roll" processes and the substrate can be both flexible and rigid, such as glass, poly(ethylenenaphthalate) (PEN), poly(ethyleneterepthalate) (PET), polycarbonates (PC), polyethersulphone (PES) and polyetheretherketon (PEKK).

(6) The embossing steps can be performed by thermally deforming a polymer or embossing a liquid polymer at room temperature and then curing the materials through thermal annealing or UV irradiation.

(7) A range of materials can form the embossing stamp 100. The materials include semiconductors (Si and Ge), metals (Ni, Pt, W), alloys, ceramics, or polymers with a high glass transition temperature.

(8) Similar bank structures as obtained and described in accordance with the third embodiment of the present invention can be obtained by optical lithography, laser ablation, micro-embossing assisted by capillary flowing and selectively peeling-off film by detachment using a structured stump.

(9) The present invention is applicable to the manufacture of other electrochemical cells such as an Electrochromic Display Device (ECD). A typical ECD has a structure similar to that of a DSSC device as illustrated in FIG. 1. However, the functional dye layer 4 is replaced by an electrochromic material layer 4. An ECD undergoes a reversible colour change when an electric current or voltage is applied across the device. The nanostructure type ECD comprises a molecular monolayer of electrochromic material, which is transparent in oxidised state and coloured in reduced state.

The invention claimed is:

1. A method of forming a component of an electrochemical cell, comprising:
    forming a first electrode on a substrate;
    forming a polymer layer on the first electrode;
    stamping the polymer layer to form a first embossed polymer layer using an embossing tool, the embossing tool having a pattern;
    removing the embossing tool from the polymer layer; and
    removing a part of the first embossed polymer layer to form a second embossed polymer layer, a part of the first electrode being exposed; and
    forming a metal oxide and a dye on an exposed electrode by an ink jet process, including depositing a metal oxide colloidal suspension and a dye solution into a cavity of the second embossed polymer layer by the ink jet process.

2. A method of fabricating an electrochemical cell, comprising:
    forming a first electrode on a substrate;
    forming a polymer layer on the first electrode;
    stamping the polymer layer to form a first embossed polymer layer using an embossing tool, the embossing tool having a pattern;
    removing the embossing tool from the polymer layer;
    removing a part of the first embossed polymer layer to form a second embossed polymer layer, a part of the first electrode being exposed;
    forming a metal oxide and a dye on an exposed electrode by an ink jet process, including depositing a metal oxide colloidal suspension and a dye solution into a cavity of the second embossed polymer layer by the ink jet process; and
    forming a second electrode and an electrolyte on the metal oxide.

3. The method of fabricating an electrochemical cell according to claim 2, further comprising:
    performing a hydrophobic treatment over a surface of the polymer layer before forming the metal oxide and the dye on the exposed electrode.

* * * * *